(12) United States Patent
Boulerne

(10) Patent No.: US 7,595,709 B1
(45) Date of Patent: Sep. 29, 2009

(54) MULTIPLE-CARRIAGES HIGH GAMMA TUNER

(75) Inventor: Philippe Boulerne, 6980 Lacroix, Montreal, PQ (CA) H4E 2V3

(73) Assignee: Philippe Boulerne, Montreal (CA)

( * ) Notice: Subject to any disclaimer, the term of this patent is extended or adjusted under 35 U.S.C. 154(b) by 91 days.

(21) Appl. No.: 12/075,292

(22) Filed: Mar. 11, 2008

(51) Int. Cl.
*H03H 7/38* (2006.01)
(52) U.S. Cl. ...................... 333/263; 324/642
(58) Field of Classification Search ............... 333/17.3, 333/263; 324/642, 637, 76.51, 76.49
See application file for complete search history.

(56) References Cited

U.S. PATENT DOCUMENTS 7,548,069 B2 * 6/2009 Simpson ............... 324/537

* cited by examiner

*Primary Examiner*—Stephen E Jones

(57) ABSTRACT

The present invention discloses a class of independent or linked facing tuning elements to be used in loadpull high gamma slide-screw tuner consisting of a radio-frequency (RF) transmission media comprising impedance tuning elements such as probes, corrugated probes, multi-section probes or single stub/double stub harmonic resonators. Multiple carriages can support multiple pairs of independent or dependent facing tuning elements. This invention, by decreasing the distances between the probes, allows the increasing of the modulus of the VSWR/Gamma. Also two dependent probes can be controlled with only two remote controls, one for the VSWR/Gamma phase control and another one for the VSWR/Gamma amplitude control.

24 Claims, 17 Drawing Sheets

US 6,674,293 B1

US 7,102,457 B1

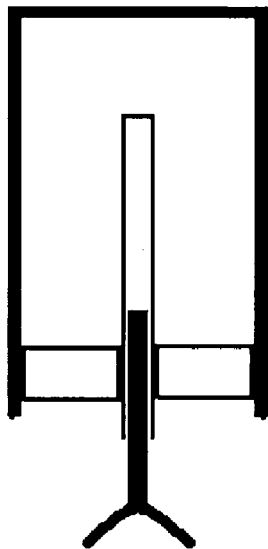
Prior Art  *Fig 19*
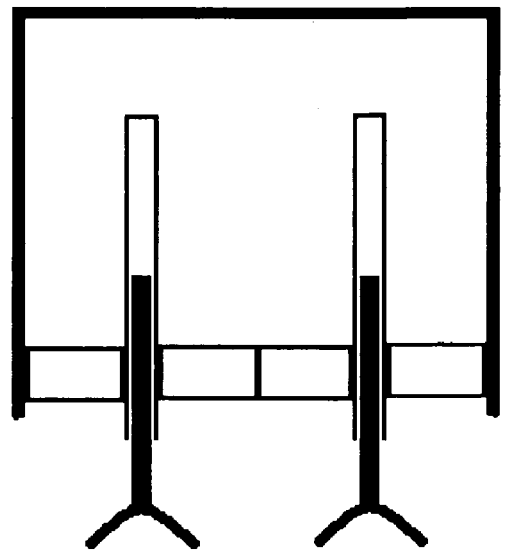
Prior Art  *Fig 20*
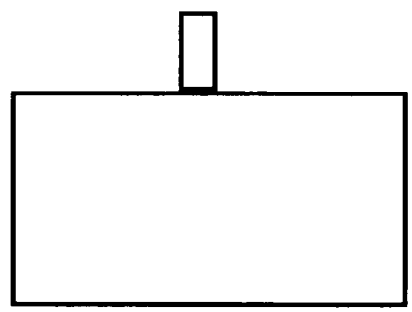
Prior Art  *Fig 21*
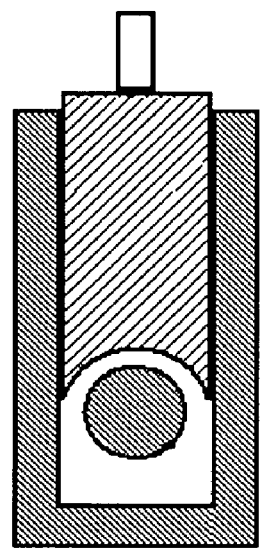
Prior Art
*Fig 22*

Prior Art  *Fig 23*
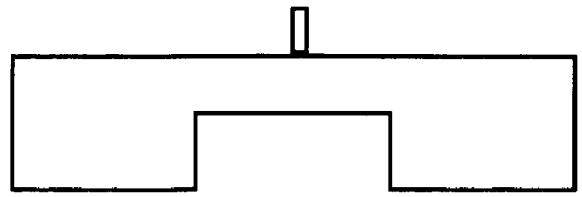
Prior Art  *Fig 24*
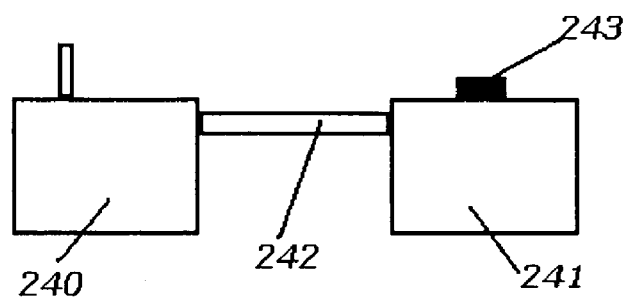
Prior Art  *Fig 25*
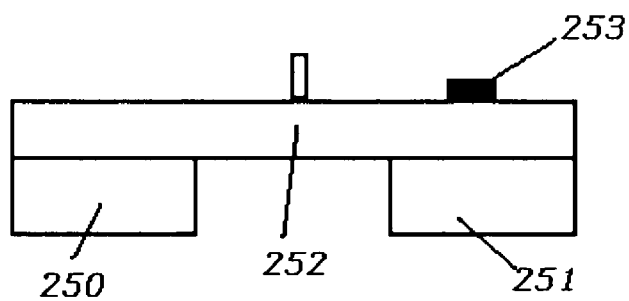
Prior Art  *Fig 26*
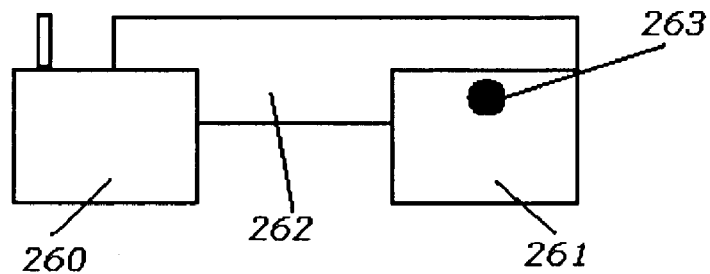

MULTIPLE-CARRIAGES HIGH GAMMA TUNER

CROSS REFERENCE TO RELATED APPLICATIONS

U.S. Patent Documents:

| | | | |
|---|---|---|---|
| 6,674,293 | Jan. 06, 2004 | Tsironis | 324/638 |
| 6,850,076 | Feb. 01, 2005 | Tsironis | 324/637 |
| 6,980,064 | Dec. 27, 2005 | Boulerne | 333/17.3 |
| 6,992,538 | Jan. 31, 2006 | Boulerne | 333/17.3 |
| 7,009,463 | Mar. 07, 2006 | Boulerne | 333/17.3 |
| 7,034,629 | Apr. 25, 2006 | Tsironis | 333/17.3 |
| 7,102,457 | Sep. 05, 2006 | Tsironis | 333/17.3 |
| 7,042,233 | May. 09, 2006 | Boulerne | 324/642 |
| 7,135,941 | Nov. 14, 2006 | Tsironis | 333/17.3 |
| 7,280,012 | Oct. 09, 2007 | Boulerne | 333/263 |

U.S. Application Documents:

| | | |
|---|---|---|
| 11/468,433 | Aug. 30, 2006 | Simpson |

OTHER REFERENCES

1 LANGE Julius, Microwave Transistor Characterization Including S-Parameters, Texas Instruments, in Hewlett Packard Application Note 95

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to a specific slide-screw tuner that includes a transmission line in some media, such as coaxial, slabline, waveguide or microstrip where one or more probes, slugs or tuning elements can move perpendicularly and in parallel to the center conductor. As a probe moves closer to the center conductor, the mismatch at some frequency will increase, while the mismatch decreases as the probe moves away from the center conductor.

The technique of subjecting DUT (Device Under Test) to variable load impedance or variable source impedance with corresponding load slide-screw tuner and source slide-screw tuner, commonly referred to as "loadpull" or "sourcepull", is used to test transistors for amplifier, oscillator or frequency multiplier applications. The DUT performance typically depends on the impedance seen by the DUT at its input and output ports, so the slide-screw tuners play the important role of creating the desired impedance at each reference plane, impedance that are controllable in amplitude and phase on the source side and on the load side of the DUT.

2. Description of Prior Art

FIG. 1 schematically depicts a perspective view of a loadpull prematch tuner of U.S. Pat. No. 6,674,293 B1. This prematch tuner has two probes (3) and (4) located on the same side of the slabline (2) compared to the center conductor (1).

FIG. 2 schematically depicts a longitudinal cross-sectional view of a loadpull multi-purpose tuner of U.S. Pat. No. 7,135, 941 B1 with 3 probes (23), (24) and (25) located on the same side of the slabline (22) compared to the center conductor (21). This loadpull slide-screw tuner has also transversal walls (26) and (27) in order to separate the 3 carriages P1, P2 and P3 that are supporting the probes (23), (24) and (25). This view demonstrates that carriages P1, P2 and P3 have a longitudinal width which is much bigger than the longitudinal width of the probes (23), (24) and (25). As it is noticeable on this figure, there is a physical impossibility to put the 3 probes closer by reducing L1 and L2 because of the longitudinal width of carriages P1, P2 and P3. This implies a decrease of performance for VSWR/Gamma due to the losses added by a longer propagation along the transmission media. The higher the frequency, the bigger the losses.

FIG. 4 schematically depicts a perspective view of a loadpull slide-screw tuner of U.S. patent application Ser. No. 11/468,433 that depicts a transmission media composed of two parallel slabs (41) and (42) surrounding a center conductor (40). Probe (44), tuning element of the slide-screw tuner, is located on one side of the slabline, the other side of the slabline being terminated with a ground plane (43). Again, one side of the slabline is terminated with a ground plane making it impossible to insert a tuning element on the opposite side of the slabline by design.

FIG. 3 schematically depicts a longitudinal cross-sectional view of a loadpull slide-screw tuner with a transmission media (31), a carriage (32) supporting a probe (34) sliding along the transmission media on a rail (33). A carriage counterweight (35) is located on the other side of the transmission media. This carriage counterweight disables the possibility to access the opposite probe side of the transmission media by design.

BRIEF SUMMARY OF THE INVENTION

In the prior art that has been exposed, the remaining problem are the RF losses between the different probes that are happening due to the fact that the carriages supporting the probes are much bigger than the probes and are all located on the same side of the transmission media. Therefore it is impossible to decrease the distances between the probes. The higher in frequency the loadpull slide-screw tuner operates, the more important that phenomenon operates, because losses are proportional to the number of wavelengths between the probes. Since RF losses are directly responsible for the decreasing of the VSWR/Gamma, it is under the biggest interest in loadpull slide-screw tuner to have the different probes or tuning elements operate as close as possible and decrease to a maximum the longitudinal distances between the probes.

The problem remaining in the prior art has been solved in accordance with the present invention which relates to a class of loadpull slide-screw tuner where the tuning elements or RF probes can be located on the two side of the transmission media. Therefore, two adjacent probes can be moved longitudinally as close as possible within the transmission media, because two adjacent probes have their carriages on the opposite side of the transmission media.

BRIEF DESCRIPTION OF THE SEVERAL VIEWS OF THE DRAWING

Features and advantages of the disclosure will readily be appreciated by persons skilled in the art from the following detailed description when read in conjunction with the drawing wherein:

FIG. 7': depicts a transversal cross-sectional view of a pair of independent facing tuning elements within a transmission media including two carriages and two counterweights mounted on twin carriages, two probe holders and the electronic remote control for two independent transversal positioning, independent longitudinal positioning being accommodated with two lead screws.

FIG. 9': depicts a top view of a transmission media with three pairs of independent facing tuning elements mounted on carriages with counterweights mounted on twin carriages, the three carriages on the same side being separated by walls.

FIG. 10': depicts a transversal cross-sectional view of a pair of facing tuning elements within a transmission media including a carriage and counterweights mounted on a twin carriage, two probe holders and the electronic remote controls for independent transversal, simultaneous longitudinal positioning being accommodated with a lead screw.

FIG. 12': depicts a top view of a transmission media with three pairs of independent facing tuning elements mounted on 3 carriages.

FIG. 13': depicts a transversal cross-sectional view of a pair of linked facing tuning elements within a transmission media including a carriage and a counterweight mounted on a twin carriage, one probe holder link and the electronic remote control for oppositely transversal positioning, simultaneous longitudinal positioning being accommodated with a lead screw.

FIG. 19. PRIOR ART: schematically illustrates a cross-sectional view of a tuning element being a single stub. The length of the stub can be fixed or adjusted by pushing down the stub on the center conductor.

FIG. 20. PRIOR ART: schematically illustrates a cross-sectional view of a tuning element being a double stub. The length of the two stubs can be fixed or adjusted by pushing down the two stubs on the center conductor.

FIG. 21: PRIOR ART: schematically illustrates a cross-sectional view of a tuning element being a single parallelepipedic probe.

FIG. 22. PRIOR ART: schematically illustrates a transversal cross-sectional view of a tuning element being a single parallelepipedic probe.

FIG. 23. PRIOR ART: schematically illustrates a corrugated probe or a multi-sections probe with 2-sections fabricated of a metal, anodized metal or metalized dielectric material.

FIG. 24. PRIOR ART: schematically illustrates a corrugated probe or multi-sections probe with 2-sections fabricated of a metal, anodized metal or metalized dielectric material, the different sections of the probe being linked with a bar.

FIG. 25. PRIOR ART: schematically illustrates a corrugated probe or multi-sections probe with 2-sections fabricated of a metal, anodized metal or metalized dielectric material, the different sections of the probe being linked with a metallic or dielectric probe holder.

FIG. 26. PRIOR ART: schematically illustrates a corrugated probe or multi-sections probe with 2-sections fabricated of a metal, anodized metal or metalized dielectric material, the different sections of the probe being linked with a metallic or dielectric septum.

DETAILED DESCRIPTION OF THE INVENTION

Figure 1:
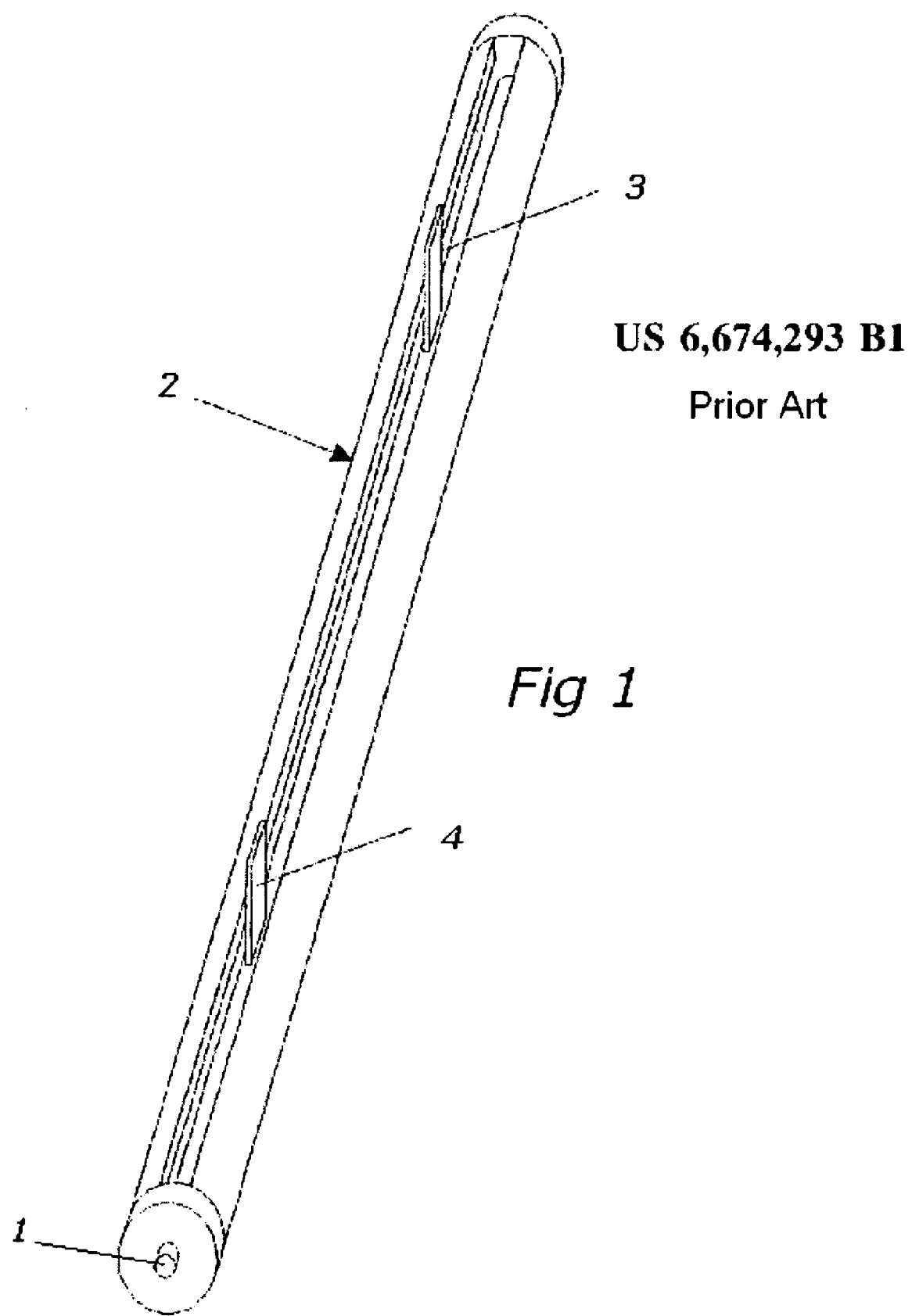
FIG. 1: PRIOR ART: U.S. Pat. No. 6,674,293 B1 Prematching tuner illustration with 2 independents probes located on the same side of the slabline.
Figure 2:
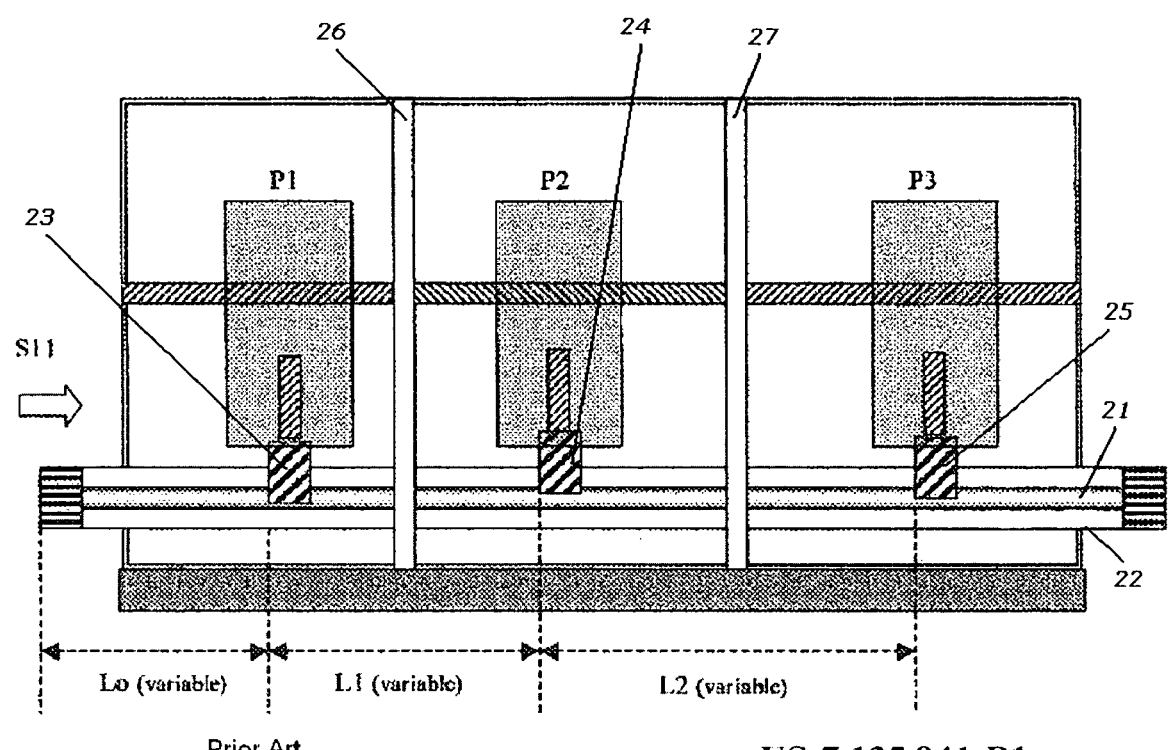
FIG. 2: PRIOR ART: U.S. Pat. No. 7,135,941 B1 Multi-Purpose tuner illustration with 3 independent carriages located on the same side of the slabline, which are separated by walls.
Figure 3:
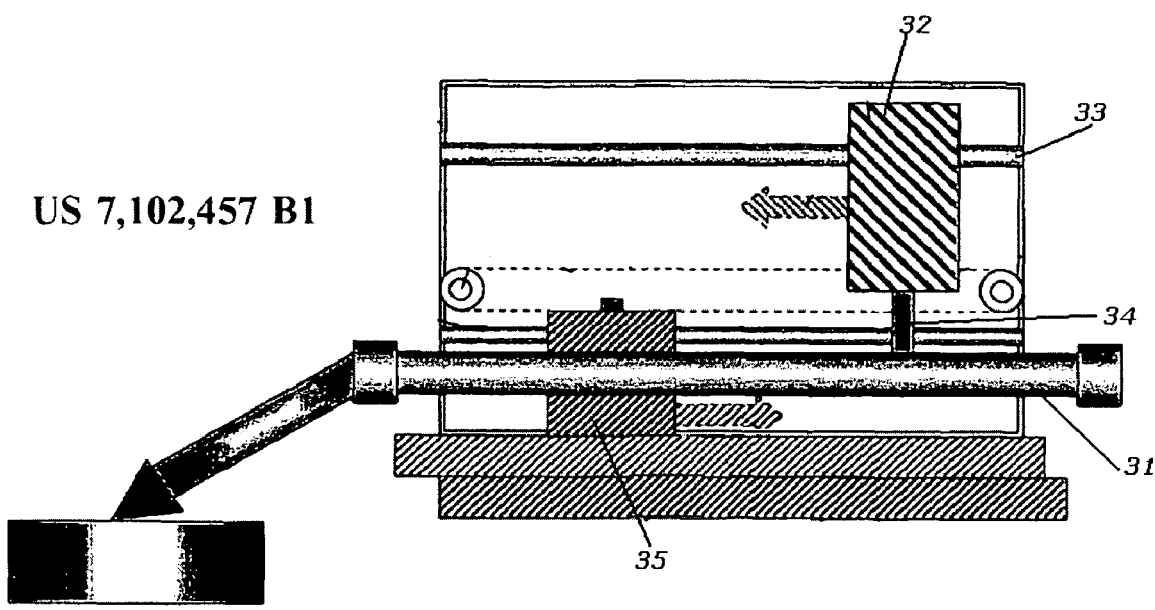
FIG. 3: PRIOR ART: U.S. Pat. No. 7,102,457 Balancing Kit illustration in a single carriage tuner.
Figure 4:
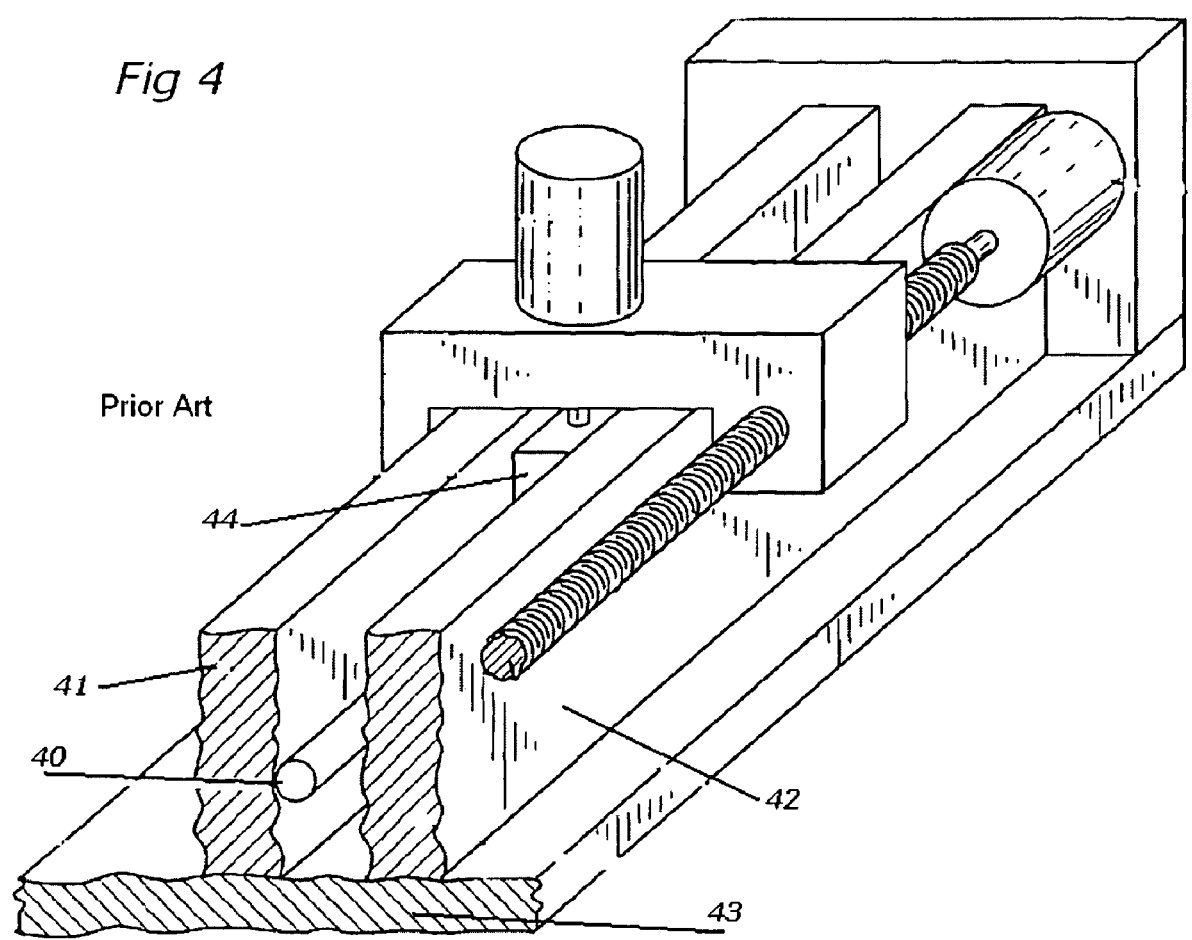
FIG. 4: PRIOR ART: application Ser. No. 11/468,433 Illustration of a slide-screw tuner from Maury Microwaves with single side access to the center conductor.

In the following detailed description and in the several figures of the drawing, like elements are identified with like reference numerals. The figures are not to scale, and relative feature sizes may be exaggerated for illustrative purposes.

Figure 5:
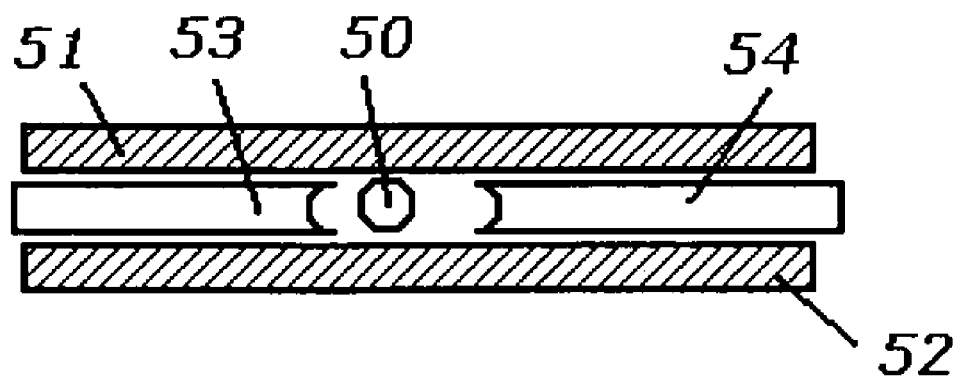
FIG. 5: depicts a transversal cross-sectional view of pair of independent facing tuning elements within a transmission media for propagating RF signals with a center conductor having an ellipsoidal cross-section.

FIG. 5 schematically depicts a cross-sectional view of an exemplary embodiment a facing tuning system, composed of two tuning elements (53, 54) within a transmission media composed of two parallel ground plane slabs (51, 52) surrounding a center conductor (50), one tuning element on each side of the slabline. Moving the facing tuning elements (53, 54) transversally to the center conductor (50) makes the amplitude of the VSWR/Gamma generated on the center conductor vary. Moving the tuning elements (53, 54) longitudinally to the center conductor makes the phase of the VSWR/Gamma generated on the center conductor vary. On FIG. 5, the center conductor is ellipsoidal, such as, but not limited to circular.

Figure 6:
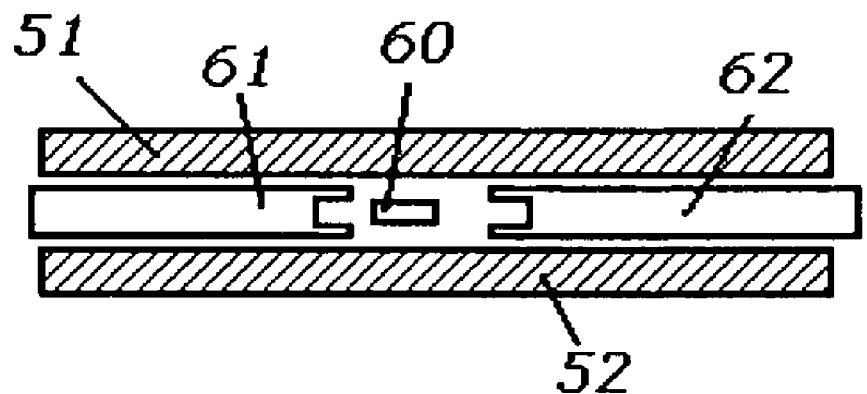
FIG. 6: depicts-a transversal cross-sectional view of pair of independent facing tuning elements within a transmission media for propagating RF signals with a center conductor having a rectangular cross-section.

FIG. 6 schematically illustrates a cross-sectional view of a pair of facing tuning elements within a transmission media composed of two parallel ground plane slabs (51,52) with a center conductor (60) having a rectangular cross section, tuning elements (61,62) having an appropriate excavation in order to surround the center conductor (60).

Tuning elements (53,54,61,62) used with this invention can be contacting or non-contacting the grounded slabs (51, 52). The two parallel slabs and the tuning elements are fabricated of a metal, anodized metal or metalized dielectric material. In the case of contacting tuning elements, a metallic foam can be inserted between the tuning elements and the slabs in order to increase the contacting surface or the quality of the contact between the tuning elements and the parallel slabs.

Tuning elements can be traditional parallelepipedic probes as illustrated by FIGS. 21 and 22.

Also corrugated probes or multi-sections probes can be used as tuning elements on one side or on the two side of this invention. FIGS. 23,24, 25 and 26 illustrate such tuning elements.

FIG. 24 schematically illustrates a corrugated probe or multi-sections probe with 2-sections fabricated of a metal, anodized metal or metalized dielectric material, the different sections of the probe (240, 241) being linked with a bar (242). At least one section (241) of the multi-sections probe can be adjusted with a screw (243).

FIG. 25 schematically illustrates a corrugated probe or multi-sections probe with 2-sections fabricated of a metal, anodized metal or metalized dielectric material, the different sections of the probe (250, 252) being linked with a metallic or dielectric probe holder (252). At least one section (251) of the multi-sections probe can be adjusted with a screw (253).

FIG. 26 schematically illustrates a corrugated probe or multi-sections probe with 2-sections fabricated of a metal, anodized metal or metalized dielectric material, the different sections of the probe (260, 261) being linked with a metallic or dielectric septum (262). At least one section (261) of the multi-sections probe can be adjusted with a screw (263).

Tuning elements can also be harmonic resonator as illustrated by FIGS. 19 and 20. The length of the stubs can be adjusted by pushing the stubs toward the center conductor in order to make the stubs shorter and therefore increase the resonant frequency.

An aspect of one embodiment provides a technique of controlling the VSWR/Gamma and phase of a slide-screw tuner with at least two independent probes, one probe on each side of the transmission media.

Figure 7:
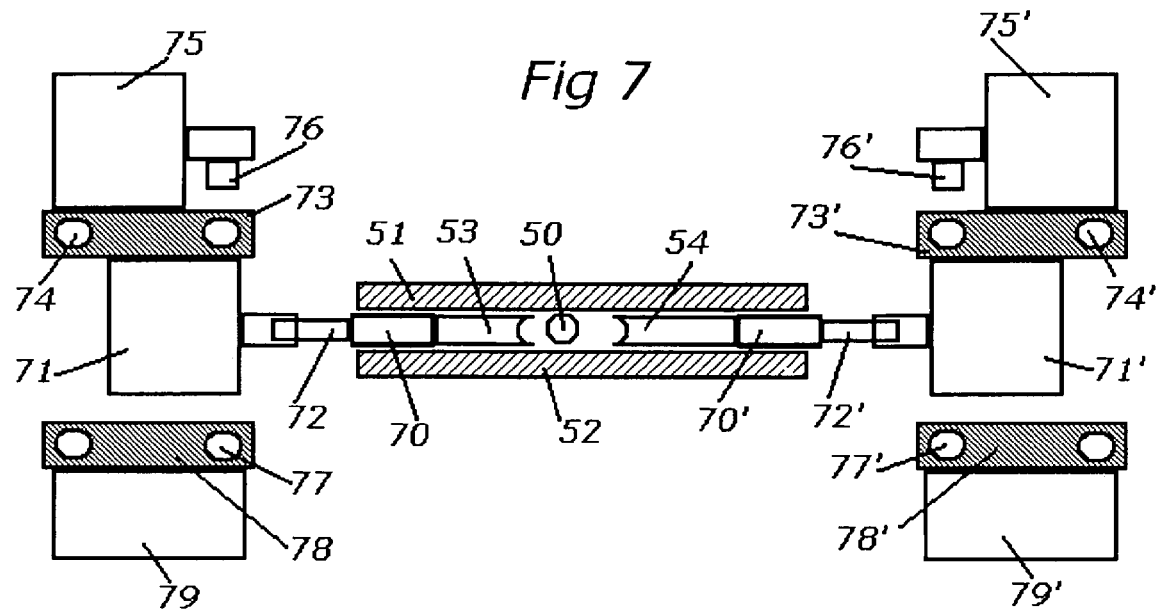
FIG. 7: depicts a transversal cross-sectional view of a pair of independent facing tuning elements within a transmission media including two carriages and two counterweights mounted on carriages, two probe holders and the electronic remote controls for two independent transversal positioning and two independent longitudinal positioning.
Figure 7:
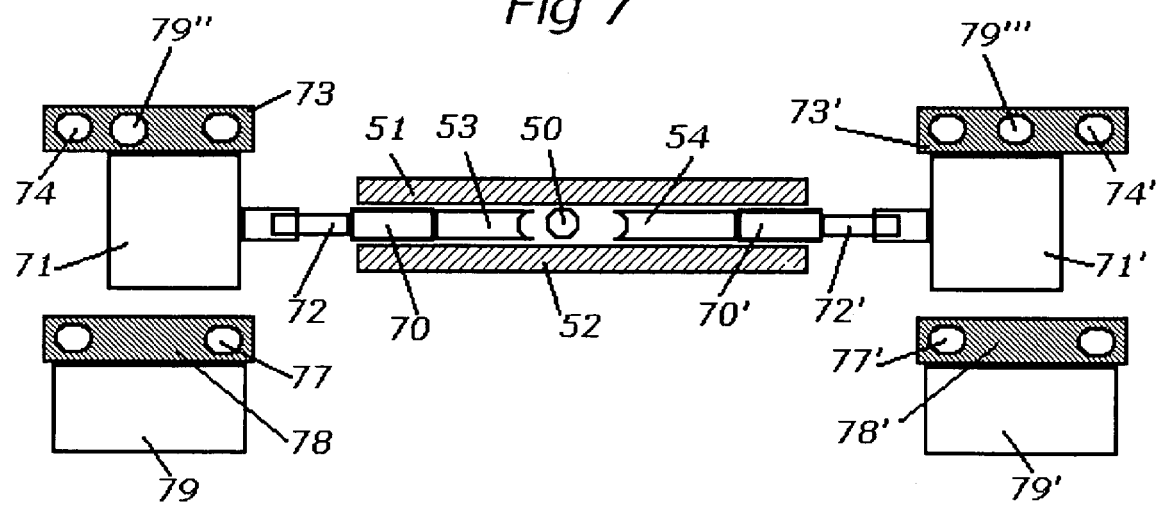

FIG. 7 schematically illustrates a cross-sectional view of this technique. In this embodiment, a transmission media composed of two parallel slabs (51, 52), fabricated of a metal or metalized dielectric material, are surrounding a center conductor (50) with two facing tuning elements (53, 54). The two tuning elements (53, 54) are respectively connected to two probe holders (70, 70'). The probe holders (70, 70') can be independently moved closer or away from center conductor (50) making the transversal distances vary, therefore increasing or reducing the VSWR/Gamma of the tuner. The transversal distances of the two tuning elements (53, 54) are controlled by two remote controls (71, 71') through respectively two screws (72, 72'). Each remote controls (71, 71') are respectively mounted on independent carriages (73, 73') that are respectively sliding on shafts (74, 74'). The longitudinal positioning of the carriages allows the control of the phase of the VSWR/Gamma of each probe independently, and therefore having the control over the full Smith Chart for each probe independently.

In a first preferred embodiment of this invention, the longitudinal position of the carriages (73, 73') are accommodated with remote controls (75, 75') respectively with rails (76, 76').

In a second preferred embodiment of this invention, lead screws (79", 79'") are used in order to control the longitudinal positioning of the carriages (73, 73'). This technique is illustrated in FIG. 7'.

Another aspect of one embodiment provides twin carriages (78, 78') of carriages (73, 73') sliding on shafts (77, 77') that support counterweights (79, 79') in order to leave the center gravity of the full tuner unchanged.

Figure 8:
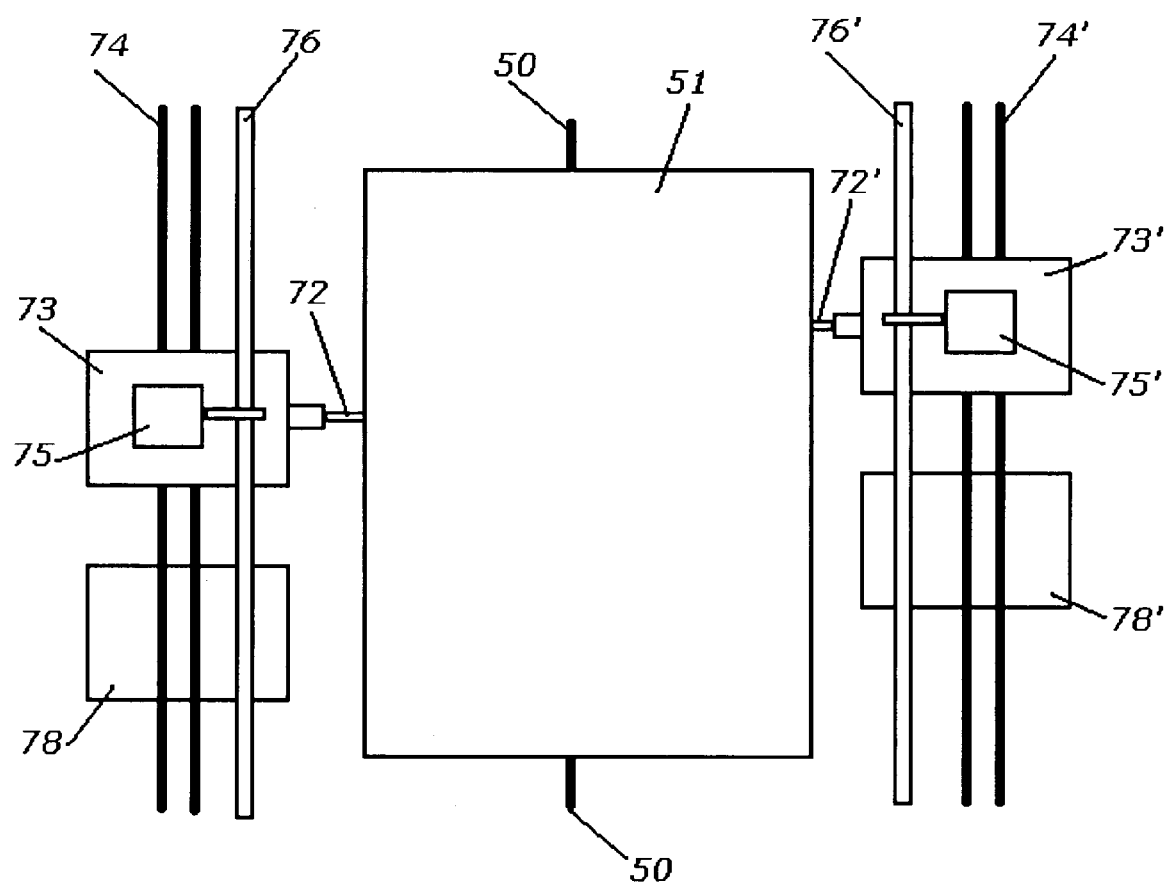
FIG. 8: depicts a top view of a pair of facing independent tuning elements within a transmission media including two carriages and two counterweights mounted on twin carriages.

FIG. 8 schematically illustrates a top view of this technique with 2 carriages.

Figure 9:
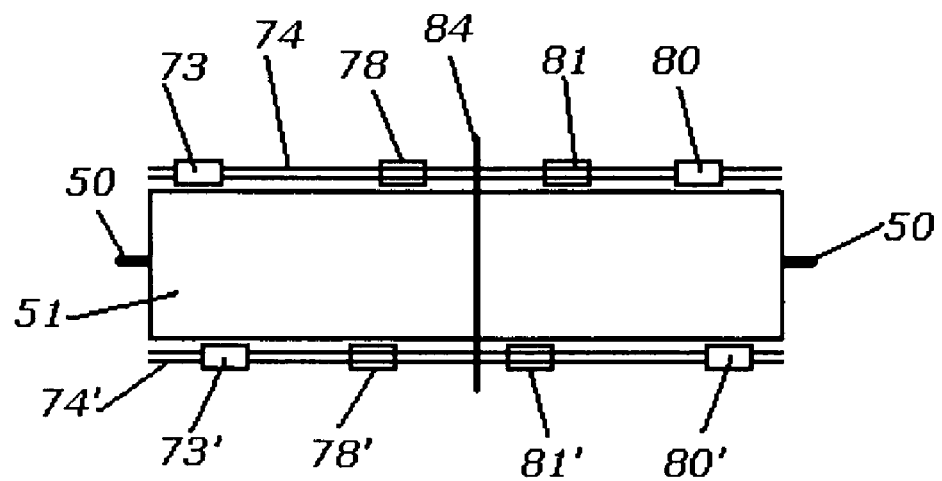
FIG. 9: depicts a top view of a transmission media with two pairs of independent facing tuning elements mounted on carriages with counterweights mounted on twin carriages, the two carriages on the same side being separated by a wall.
Figure 9:
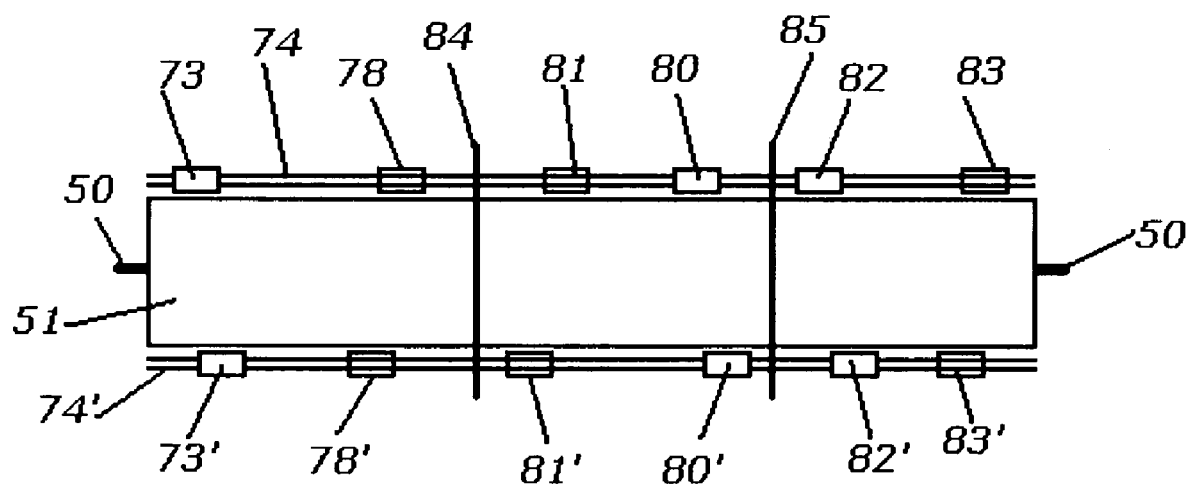

FIG. 9 schematically illustrates a top view of this technique with four carriages (73, 73', 80, 80'), carriages (73, 80) sliding on rail (74) and carriages (73', 80') sliding on rail (74').

Carriages (73, 73', 80, 80') can have twin carriages, respectively (78, 78', 81, 81') in order to act as counterweights to the overall tuner system. A transversal wall (84) can be included in the tuner system, in order to separate carriages (73, 73') from carriages (80, 80').

FIG. 9' schematically illustrates a top view of this technique with six carriages (73, 73', 80, 80', 82, 82'), carriages (73, 80, 82) sliding on rail (74) and carriages (73', 80', 82') sliding on rail (74').

Carriages (73, 73', 80, 80', 82, 82') can have twin carriages, respectively (78, 78', 81, 81', 83, 83') in order to act as counterweights to the overall tuner system. Transversal walls (84, 85) can be included in the tuner system, in order to separate carriages (73, 73') from carriages (80, 80') and (82, 82').

Another aspect of one embodiment provides a technique to mount two facing tuning elements on a common transversal carriage that is sliding in parallel with the transmission media. This technique requires only one remote controller in order to control the longitudinal position of the two facing tuning elements along the transmission media.

Figure 10:
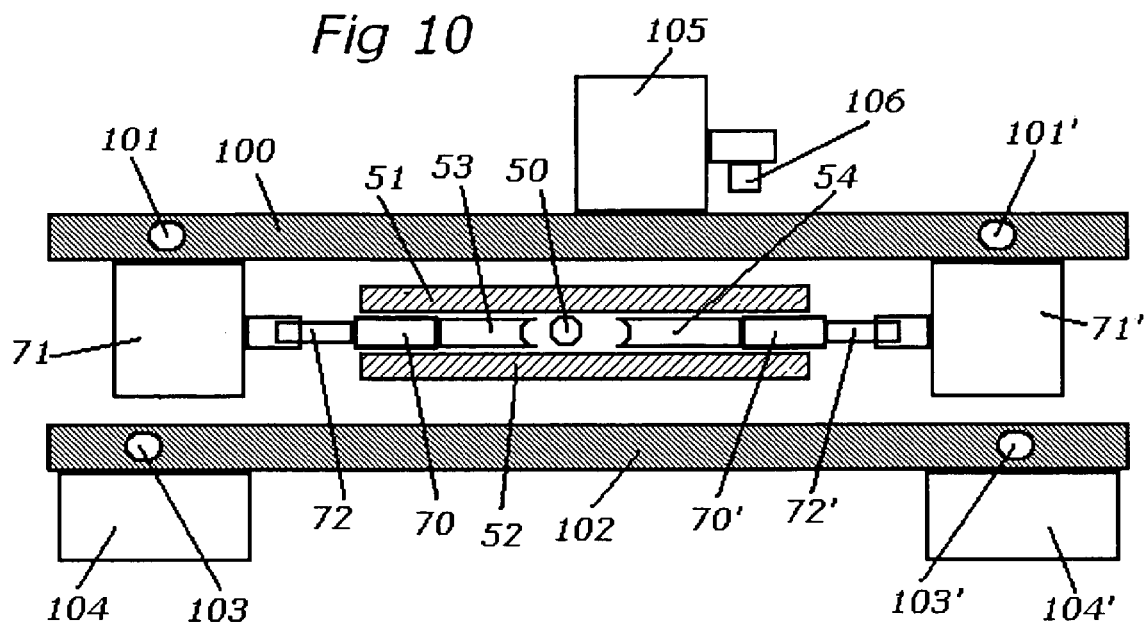
FIG. 10: depicts a transversal cross-sectional view of a pair of facing tuning elements within a transmission media including a carriage and counterweights mounted on a twin carriage, two probe holders and the electronic remote controls for independent transversal positioning and simultaneous longitudinal positioning.
Figure 10:
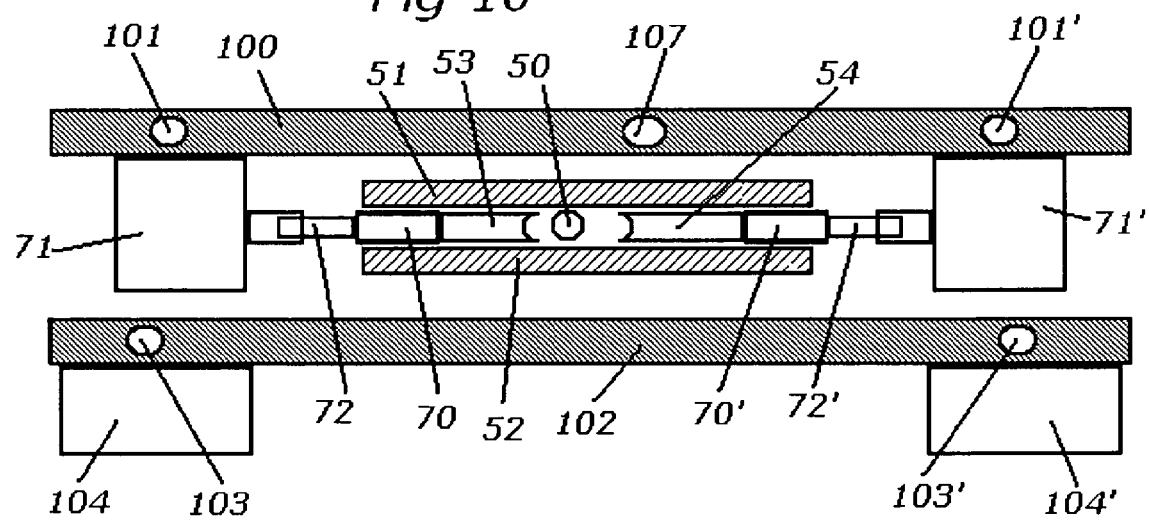

FIG. 10 schematically illustrates a cross-sectional view of this technique. In this embodiment, a transmission media composed of two parallel slabs (51, 52), fabricated of a metal or metalized dielectric material, are surrounding a center conductor (50) with two facing tuning elements (53, 54). The two tuning elements (53, 54) are respectively connected to two probe holders (70, 70'). The probe holders (70, 70') can be independently moved closer or away from center conductor (50) making the transversal distances vary, therefore increasing or reducing the VSWR/Gamma of the tuner. The transversal distances of the two tuning elements (53, 54) are controlled by two remote controls (71, 71') respectively through two screws (72, 72'). The remote controls (71, 71') are mounted on a common carriage (100) that is sliding on shafts (101, 101'). This carriage displacement allows the control of the phase of the VSWR/Gamma, and therefore having the control over the full Smith Chart.

In a first preferred embodiment of this invention, another remote control (105) will allow the longitudinal positioning of the transversal carriage (100) along the shafts (101, 101') with a rail (106).

In a second preferred embodiment of this invention, a lead screw (107) is used to allow the longitudinal positioning of the carriage (100) along the shafts (101, 101'). This technique is illustrated in FIG. 10'.

Another aspect of one embodiment provides a twin carriage (102) of carriage (100) supporting counterweights (104, 104') sliding on parallel tracks (103, 103'), moving longitudinally along with the carriage (100), the combination of the movements of the carriage and the counterweight leaving the center gravity of the tuner unchanged.

Figure 11:
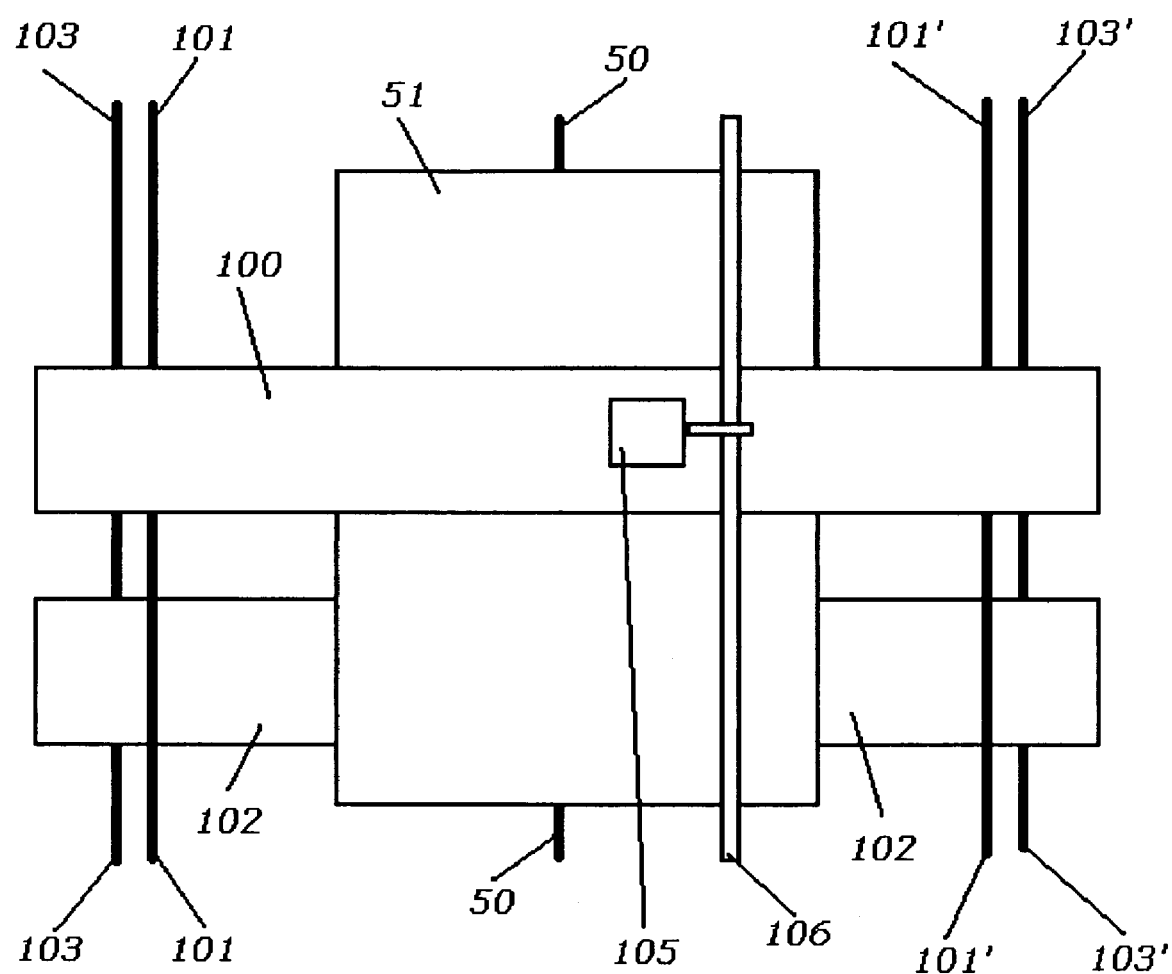
FIG. 11: depicts a top view of a transmission media with a pair of independent facing tuning elements mounted on a carriage.

FIG. 11 schematically illustrates a top view of this technique.

Figure 12:
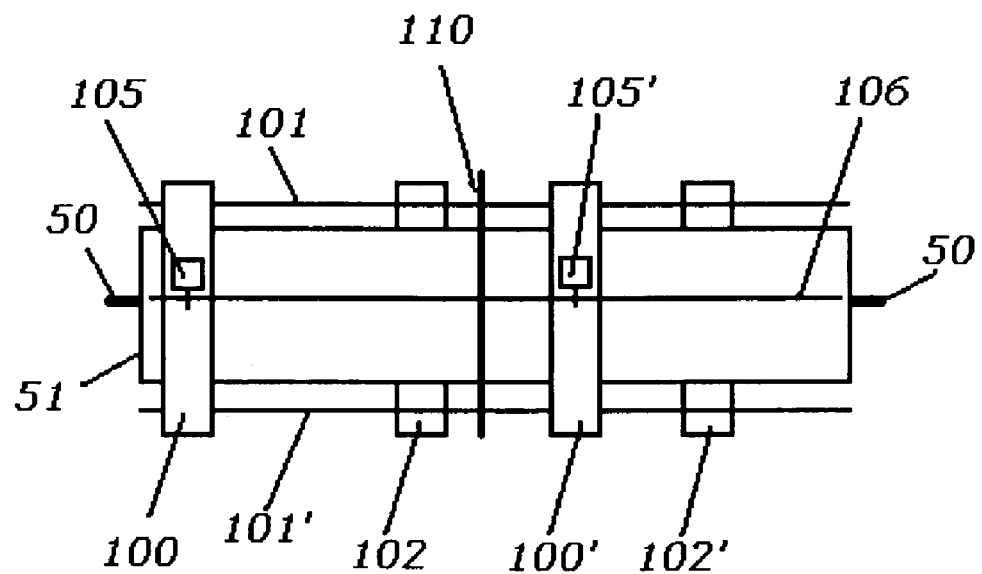
FIG. 12: depicts a top view of a transmission media with two pairs of independent facing tuning elements mounted on 2 carriages.
Figure 12:
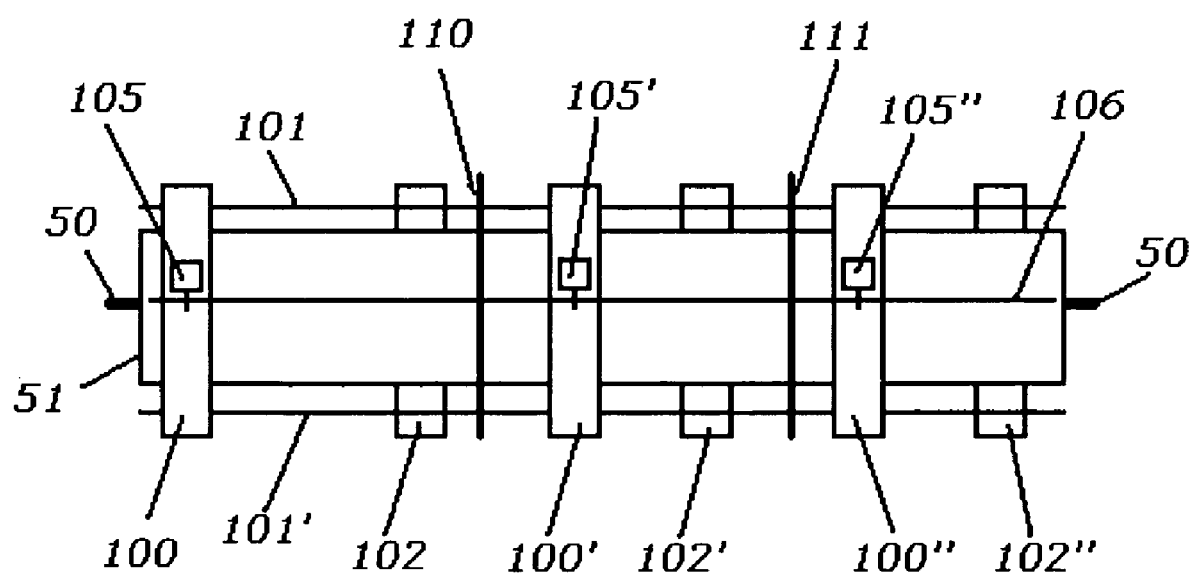

FIG. 12 schematically illustrates a top view of this technique with two transversal carriages, (100, 100') sliding on rails (101, 101'). Remote controls (105, 105') are respectively making the longitudinal positioning of carriages (100, 100') with rail (106). Carriages (100, 100') can have twin carriages (102, 102') in order to act as counterweights to the overall tuner system. A transversal wall (110) can be included in the tuner system, in order to separate carriage (100) from carriage (100').

FIG. 12' schematically illustrates a top view of this technique with three transversal carriages, (100, 100', 100") sliding on rails (101, 101'). Remote controls (105, 105', 105") are respectively making the longitudinal positioning of carriages (100, 100', 100") with rail (106). Carriages (100, 100', 100") can have twin carriages (102, 102', 102") in order to act as counterweights to the overall tuner system. Transversal walls (110, 111) can be included in the tuner system, in order to separate carriage (100) from carriage (100') and (100").

Another aspect of one embodiment provides a technique to link together two facing tuning elements that are mounted on a common transversal carriage. This technique requires only one remote controller in order to control the distances of the two tuning elements compared to the center conductor.

Figure 13:
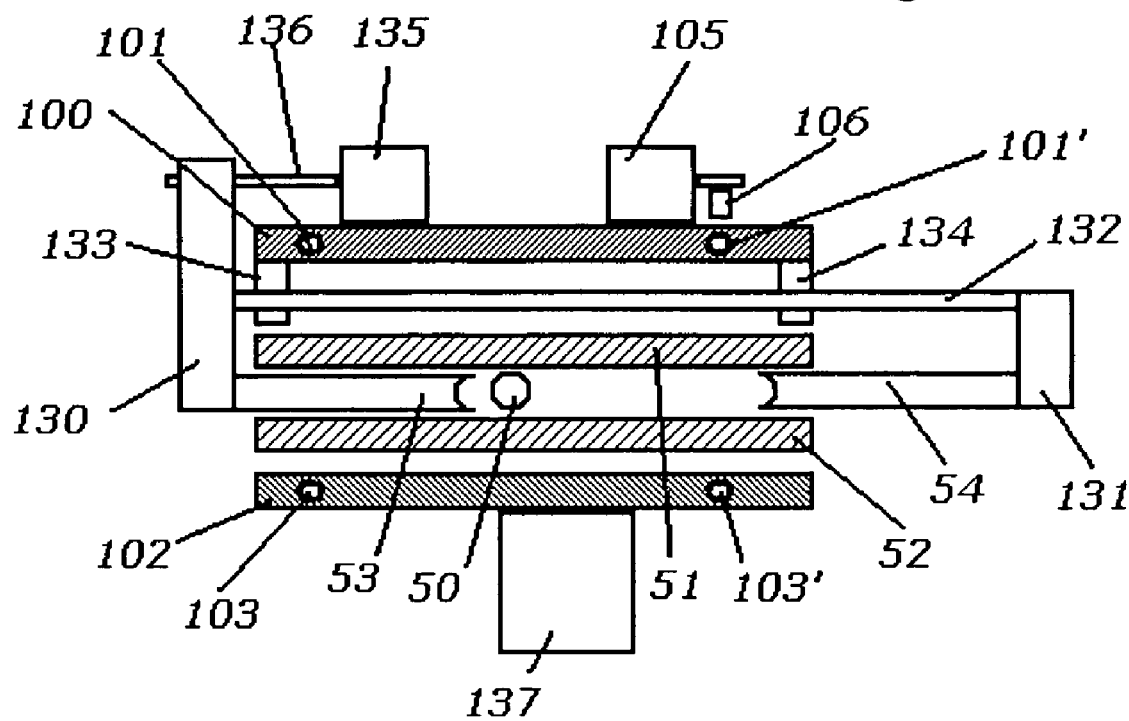
FIG. 13: depicts a transversal cross-sectional view of a pair of linked facing tuning elements within a transmission media including a carriage and a counterweight mounted on a twin carriage, one probe holder link and the electronic remote controls for oppositely transversal positioning and simultaneous longitudinal positioning.
Figure 13:
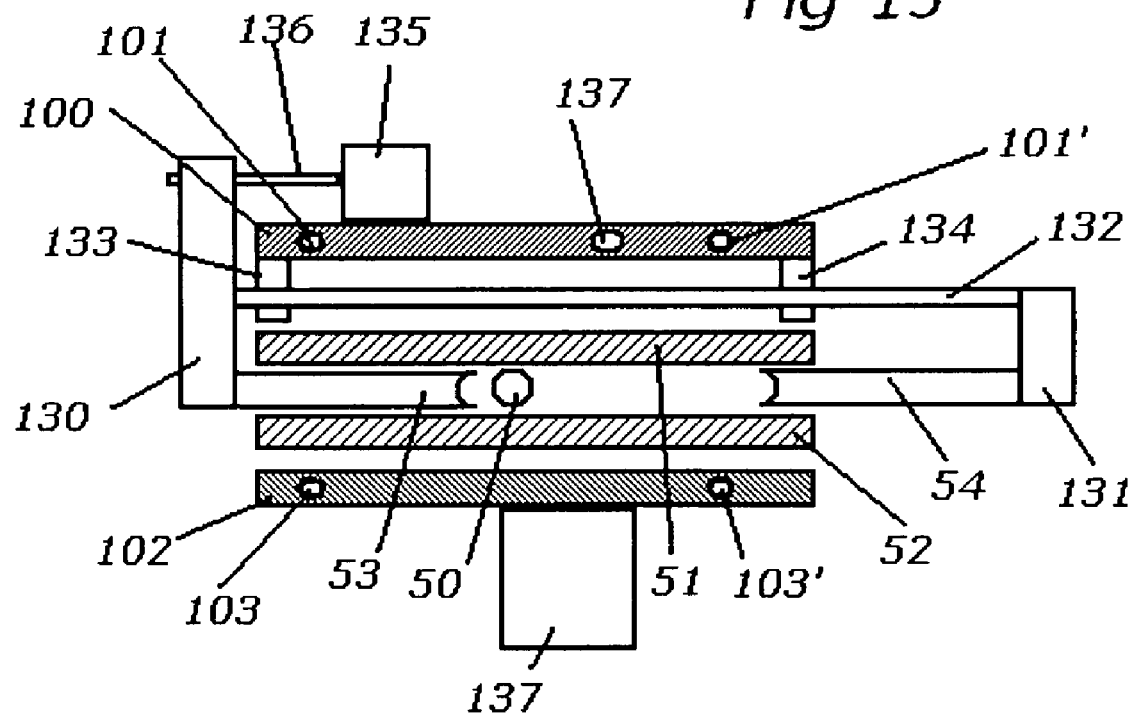

FIG. 13 schematically illustrates a cross-sectional view of this technique. In this embodiment, a transmission media composed of two parallel slabs (51, 52), fabricated of a metal or metalized dielectric material, are surrounding a center conductor (50) with two facing tuning elements (53, 54). The two tuning elements (53, 54) are connected to two probe holders (130, 131), which probe holders are connected together trough a probe holder link (132, 132'). The probe holder link (132, 132') is supported by a carriage (100) through linear bearings (133, 134). The carriage is sliding on parallel tracks, such as, but not limited to shafts (101,101'). A remote control (135) is mounted on the carriage (100) driving a lead screw (136) that controls the transversal position of the probe holder link (132). This control of the distances of the two probes (53,54) compared to the center conductor (50) allows to put one probe (53) or (54) closer than the opposite probe, respectively (54) or (53) to the center conductor (50) and therefore control the amplitude of the VSWR/Gamma with one probe or the other. With this architecture, both probes can not be used simultaneously within the tuner. Typically using this architecture will allow to design the two probes (53) and (54) to cover different frequency bandwidth.

In a first preferred embodiment of this invention, another remote control (105) will allow the longitudinal positioning of the carriage (100) along the shafts (101, 101') with a rail (106). This carriage displacement allows the control of the phase of the VSWR/Gamma, and therefore having the control over the full Smith Chart. In a second preferred embodiment of this invention, a lead screw (137) is used to allow the longitudinal positioning of the carriage (100) along the shafts (101, 101'). This technique is illustrated in FIG. 13'.

Another aspect of one embodiment provides a twin carriage (102) of carriage (100) supporting a counterweight (137) sliding on parallel tracks (103, 103'), moving longitudinally along with the carriage (100), the combination of the movements of the carriage and the counterweight leaving the center gravity of the tuner unchanged.

Figure 14:
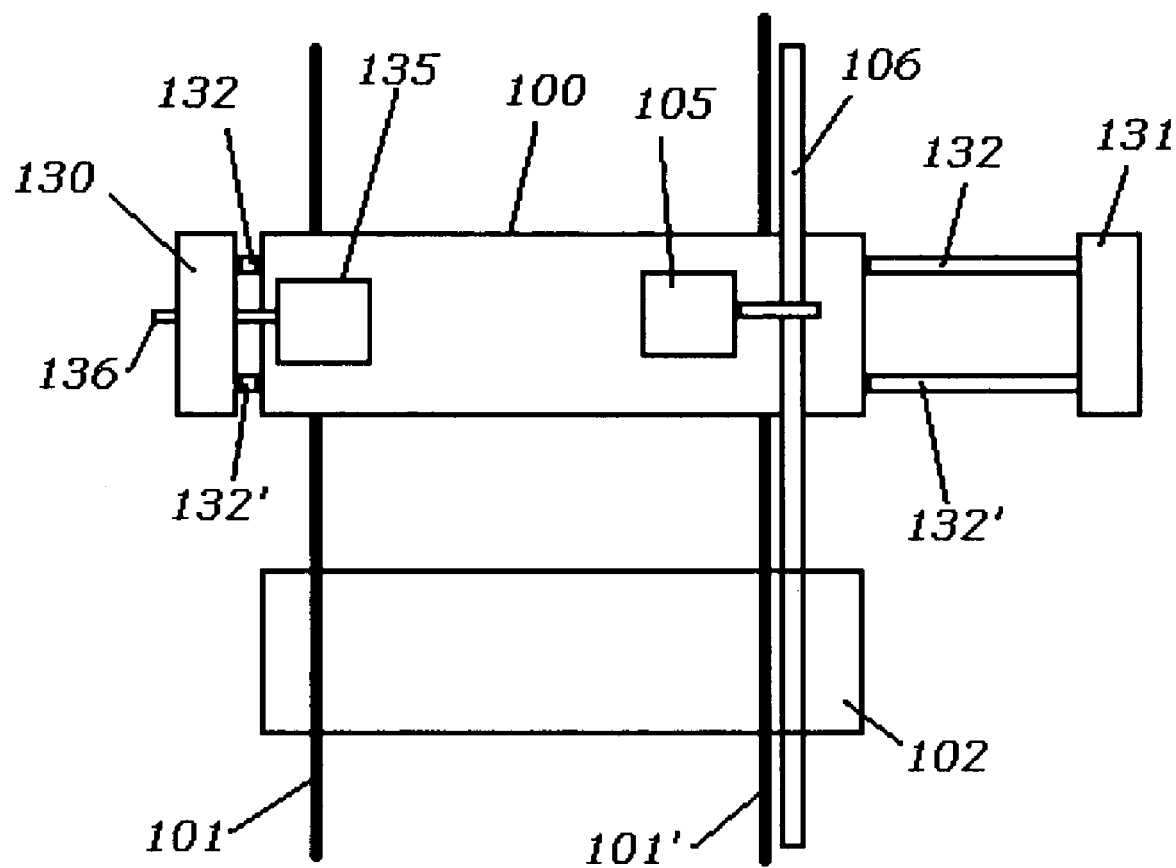
FIG. 14: depicts a top view of a transmission media with a pair of linked facing tuning elements mounted on a carriage.
Figure 15:
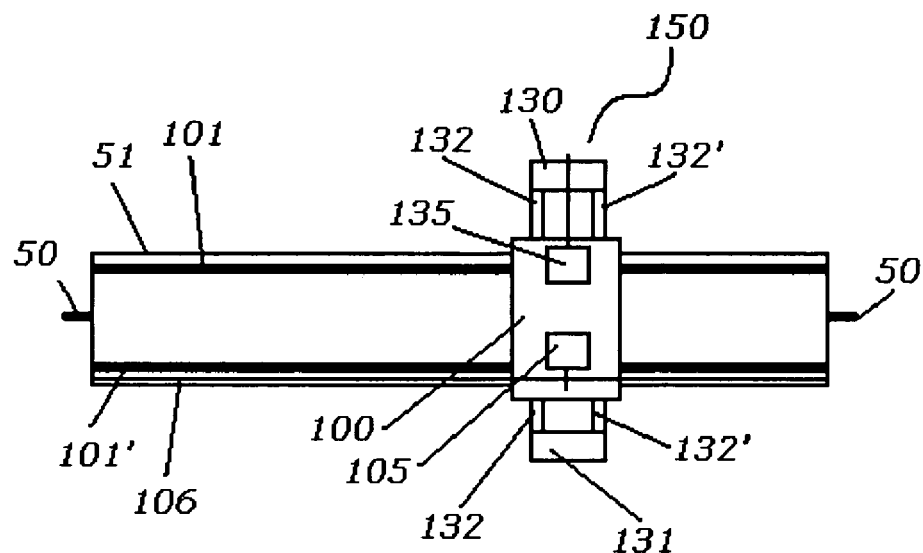
FIG. 15: depicts a top view of a transmission media with a pair of linked facing tuning elements mounted on a carriage.

FIGS. 14 and 15 schematically illustrate a top view of this technique with a single transversal carriage (150).

Figure 16:
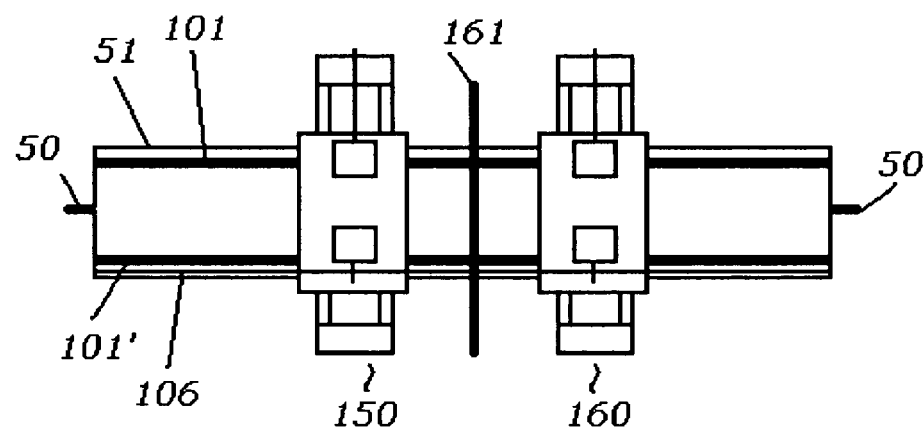
FIG. 16: depicts a top view of a transmission media with two pairs of linked facing tuning elements mounted on two carriages.

FIG. 16 schematically illustrates a top view of this technique with two transversal carriages, (150, 160). A transversal wall (161) can be included in the tuner system, in order to separate carriage (150) from carriage (160).

Figure 17:
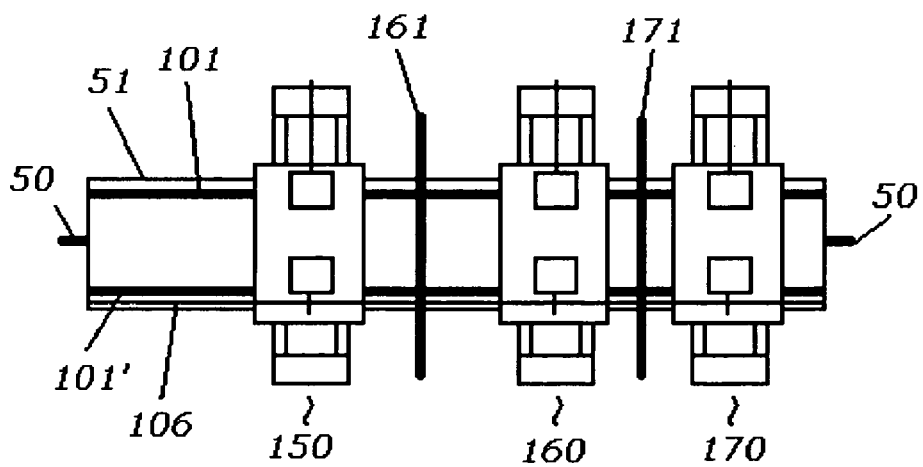
FIG. 17: depicts a top view of a transmission media with three pairs of linked facing tuning elements mounted on three carriages.

FIG. 17 schematically illustrates a top view of this technique with two transversal carriages, (150, 160, 170). Transversal walls (161, 171) can be included in the tuner system, in order to separate carriage (150) from carriage (160) and carriage (170).

Figure 18:
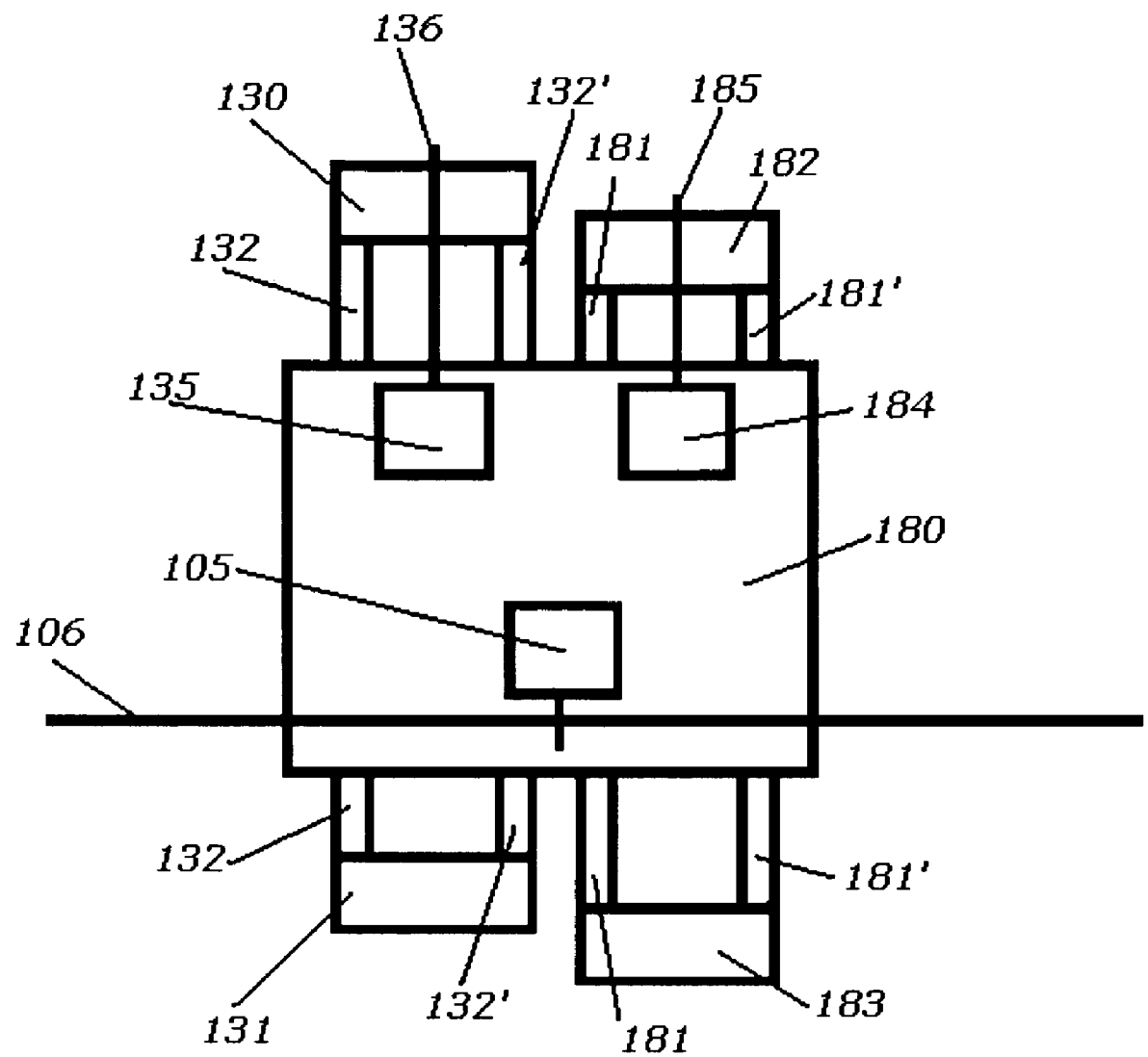
FIG. 18: depicts a top view of a transmission media with two pair of linked facing tuning elements mounted on a single carriage.

FIG. 18 schematically illustrates a top view of this technique with a transversal carriage (180) supporting two probe holder links (132, 132') and (181, 181'), probe holder link (132, 132') supporting probe holders (130) and (131), while probe holder link (181, 181') is supporting probe holders (182) and (183). Transversal distance of probe holder link (132, 132') being controlled by remote control (135) with screw (136), while transversal distance of probe holder link (181, 181') is controlled remote with control (184) with screw (185). The longitudinal positioning of transversal carriage (180) is made with remote control (105) with rail (106).

Although the present invention has been explained hereinabove by way of a preferred embodiment thereof, it should be pointed out that any modifications to this preferred embodiment within the scope of the appended claims is not deemed to alter of change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit, or scope of the general inventive concept as defined by the appended claims and their equivalents.

I claim:

1. At least two tuning elements, with at least one tuning element on each side of a transmission media for propagating RF signals, wherein said transmission media is composed of two parallel slabs surrounding a center conductor.

2. A load pull impedance tuner system comprising a transmission media and at least two tuning elements, one on each side of a transmission media of claim 1.

3. A center conductor as in claim 1, wherein said center conductor has an ellipsoidal cross section.

4. A center conductor as in claim 1, wherein said center conductor has a circular cross section.

5. A center conductor as in claim 1, wherein said center conductor has a rectangular cross section.

6. Tuning elements as in claim 1, wherein said tuning elements are longitudinally separated by transversal walls.

7. Tuning elements as in claim 1, wherein at least one tuning element is a parallelepipedic probe.

8. Tuning elements as in claim 1, wherein at least one tuning element is a corrugated probe.

9. Tuning elements as in claim 1, wherein at least one tuning element is a multi-section probe.

10. Tuning elements as in claim 1, wherein at least one tuning element is a multi-section probe, said multi-section probe as at least one section adjustable with screw.

11. Tuning elements as in claim 1, wherein at least one tuning element is a single stub harmonic resonator.

12. Tuning elements as in claim 1, wherein at least one tuning element is a double stub harmonic resonator.

13. Tuning elements as in claim 1, wherein tuning elements are contacting the two parallel slabs.

14. Tuning elements as in claim 1, wherein tuning elements are non-contacting the two parallel slabs.

15. A load pull measurement system, comprising the tuner system of claim 1.

16. A transmission media as in claim 1, wherein said transmission media is supporting at least one transversal carriage sliding longitudinally in parallel along said transmission media.

17. Transversal carriages as in claim 16, wherein said transversal carriages are supporting means of electrical remote control, making the longitudinal position of said transversal carriages controllable.

18. Transversal carriages as in claim 16, wherein said transversal carriages have twin carriages acting as counterweights of said transversal carriages.

19. At least one transversal carriage as in claim 16, wherein said transversal carriage is supporting electrical remote controls with screws, said screws are controlling probe holders connected to two facing tuning elements, making transversal distances of said two facing tuning elements to said center conductor independently controllable.

20. At least one transversal carriage as in claim 16, wherein said transversal carriage is supporting a single electrical remote control with a screw, said screw is controlling a probe holder link, said probe holder link is connected to two probe holders of two facing tuning elements, making the transversal distances of said two facing tuning elements compared to said center conductor oppositely controllable.

21. At least one transversal carriage as in claim 20, wherein said transversal carriage is supporting two electrical remote control with screws, said screws are controlling two probe holder links, each probe holder links are connected to two probe holders of two facing tuning elements, making the transversal distances of said two facing tuning elements compared to said center conductor oppositely controllable.

22. At least two tuning elements, with at least one tuning element on each side of a transmission media as in claim 1, wherein said tuning elements are connected to probe holders, linking said tuning elements to electrical remote controls with screws, making transversal distances of said tuning elements to said center conductor independently controllable, said electrical remote controls being attached to independent carriages sliding longitudinally in parallel along the transmission media.

23. Independent carriages as in claim 22, wherein said independent carriages are supporting means of electrical remote controls, making the longitudinal position of said tuning elements independently controllable.

24. Independent carriages as in claim 22, wherein said independent carriages have twin carriages acting as counterweight of said independent carriages.

\* \* \* \* \*